United States Patent [19]

Petty et al.

[11] Patent Number: 5,422,600

[45] Date of Patent: Jun. 6, 1995

[54] AMPLIFIER INPUT STAGE WITH CHARGE PUMP SUPPLYING A DIFFERENTIAL TRANSISTOR PAIR

[75] Inventors: Thomas D. Petty; Robert L. Vyne, both of Tempe; Troy L. Stockstad, Phoenix, all of Ariz.

[73] Assignee: Motorola, Inc., Schaumburg, Ill.

[21] Appl. No.: 264,290

[22] Filed: Jun. 23, 1994

[51] Int. Cl.[6] .............................................. H03F 3/45
[52] U.S. Cl. ..................................... 330/257; 330/261
[58] Field of Search ........................ 307/296.1, 296.6; 330/252, 257, 261, 288, 296

[56] References Cited

U.S. PATENT DOCUMENTS

| | | | |
|---|---|---|---|
| 4,524,328 | 6/1985 | Abou et al. | 330/252 |
| 4,847,519 | 7/1989 | Wahl et al. | 330/257 X |
| 5,153,529 | 10/1992 | Koda et al. | 330/257 X |
| 5,212,456 | 5/1993 | Kovalcik et al. | 330/261 |

Primary Examiner—Steven Mottola
Attorney, Agent, or Firm—Robert D. Atkins

[57] ABSTRACT

An input stage to an amplifier circuit (10) operating with a one volt power supply potential (32) receives a differential input signal. A charge pump (36) increases the one volt power supply potential to 1.8 volts for providing additional head-room for the differential input signal. A current source (44) controls a current mirror (40–42) to draw a predetermined current from the charge pump to supply the active conduction path of a differential transistor pair (12–14). An output stage (34) of the amplifier circuit operates off the one volt power supply potential. Since the charge pump drives only the differential transistor pair through the current mirror, it may be made small to fit on the same integrated circuit as the amplifier including any necessary pump capacitors.

20 Claims, 2 Drawing Sheets

AMPLIFIER INPUT STAGE WITH CHARGE PUMP SUPPLYING A DIFFERENTIAL TRANSISTOR PAIR

BACKGROUND OF THE INVENTION

The present invention relates in general to amplifier circuits and, more particularly, to a differential amplifier input stage operating with a charge pump supplying a differential transistor pair.

Differential amplifier circuits are used in a myriad of applications to amplify differential signals. The amplifier circuit generally requires one or more power supply potentials for operation. In many amplifiers, the common mode operating range of the differential input signal is limited to a value less than the rails of the power supply potentials. The modern trend is to lower the operating potential to the amplifier, especially for battery-supplied applications such as cellular telephones, digital pagers and portable computers. The lower operating potential is desirable as it requires fewer serially coupled battery cells to supply the operating potential to the end use circuit.

As the operating potential to the amplifier decreases, the signal headroom for common mode operating range of the differential input stage also reduces. A conventional differential amplifier circuit may comprise a differential transistor pair driven by a current source from the positive power supply potential and resistors or current sources between the differential transistor pair and the negative power supply conductor. The headroom needed for the current source and the base-emitter junction potentials of the differential transistor pair is typically 800 millivolts. For an application where the target positive power supply potential is say one volt and the negative power supply potential is ground, there is only 200 millivolts of common mode operating range for the differential input signal. The limited common mode operating range is insufficient for many applications that need low operating potentials.

Hence, a need exists to increase the common mode operating range of the differential input signal while maintaining a low power supply potential to the amplifier.

DETAILED DESCRIPTION OF THE PREFERRED EMBODIMENT

Figure 1:
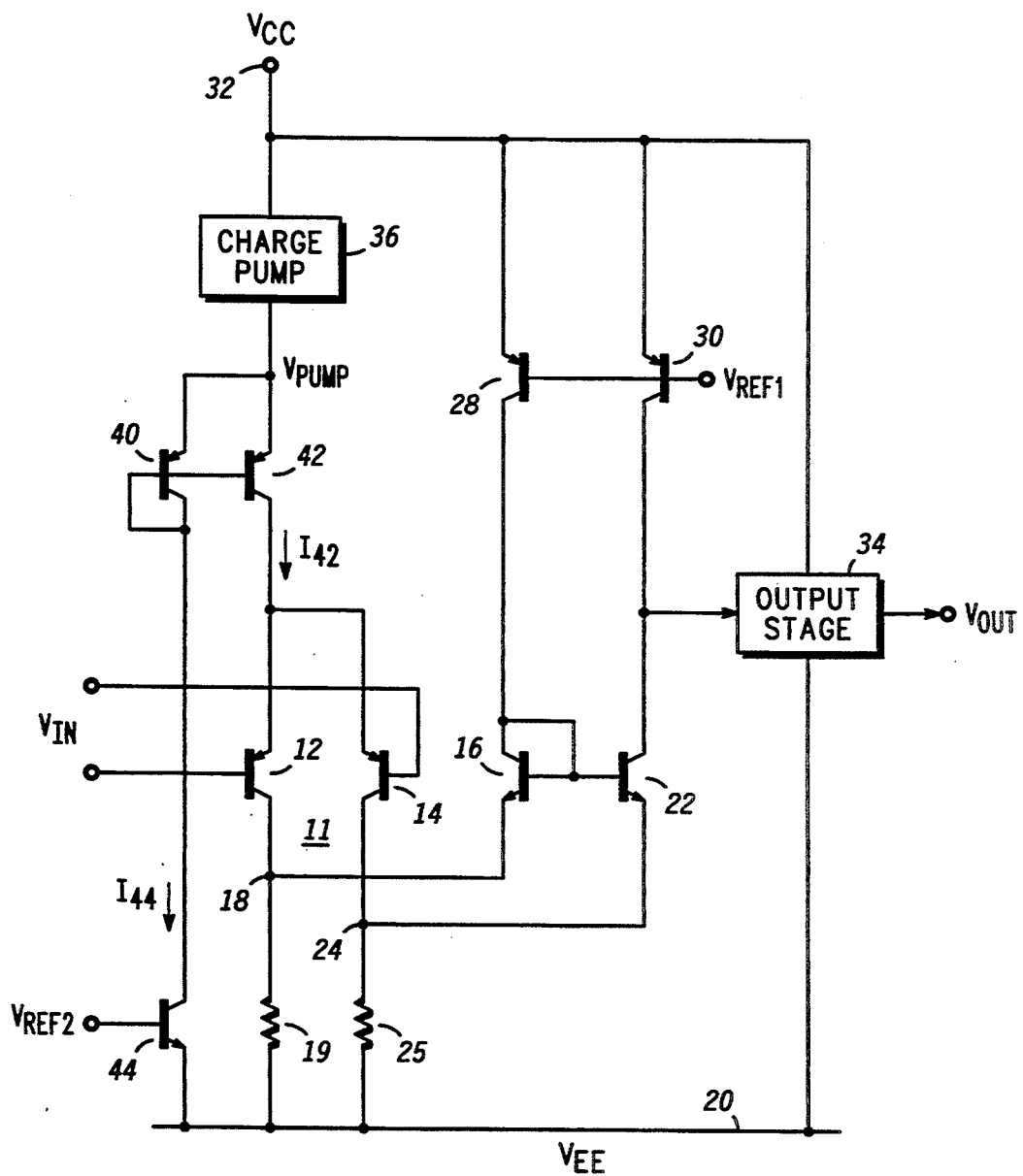
FIG. 1 is a schematic and block diagram illustrating a differential input stage of an amplifier.

Referring to FIG. 1, an amplifier circuit 10 is shown including a differential input stage 11 receiving a differential input signal $V_{IN}$ applied across the bases of differentially-coupled transistors 12 and 14. The collector of transistor 12 is coupled to the emitter of diode-configured transistor 16 at node 18 and through resistor 19 to power supply conductor 20 operating at ground potential $V_{EE}$. The collector of transistor 14 is coupled to the emitter of transistor 22 at node 24 and through resistor 25 to power supply conductor 20. The collector and base of transistor 16 are coupled together to the collector of transistor 28, while the collector of transistor 22 is coupled to the collector of transistor 30 at an input of output stage 34. The emitters of transistors 28 and 30 are coupled to power supply conductor 32 operating, for example, at a one volt positive operating potential $V_{CC}$, while the bases of transistors 28 and 30 receive a reference potential $V_{REF1}$ operating at about 400 millivolts. Transistors 28 and 30 operate as current sources to transistors 16 and 22. Output stage 34 receives the positive operating potential $V_{CC}$ from power supply conductor 32 for providing further amplification. A standard class AB transistor configuration in output stage 34 provides a single-ended output signal $V_{OUT}$ as is well known.

As part of the present invention, a charge pump circuit 36 receives the one volt $V_{CC}$ operating potential from power supply conductor 32 and provides an output voltage $V_{PUMP}$ to a current mirror circuit comprising transistors 40 and 42. The emitters of transistors 40 and 42 receive the pump voltage $V_{PUMP}$. The base and collector of transistor 40 is coupled to the collector of current-source transistor 44. A reference potential $V_{REF2}$ operating at about 600 millivolts is applied to the base of transistor 44. The emitter of transistor 44 is coupled to power supply conductor 20. Transistor 44 operates as a current source to draw a predetermined current $I_{44}$ of 1.0 microamps through transistor 40. The base and collector of transistor 40 is further coupled to the base of transistor 42, while the collector of transistor 42 is coupled to the emitters of transistors 12 and 14. A current $I_{42}$ as determined by current $I_{44}$ flows from charge pump 36 through transistor 42 into the conduction paths of differential transistor pair 12-14. The principal conduction path is through transistor 12 when the differential input signal $V_{IN}$ is more positive at the base of transistor 14. The principal conduction path is through transistor 14 when the differential input signal $V_{IN}$ is more positive at the base of transistor 12. Thus, current source transistor 44 sets a predetermined current that is mirrored through current mirror transistors 40-42 to sink current $I_{42}$ from charge pump 36 into the conduction paths of differential transistor pair 12-14. Since charge pump 36 need supply only the differential input stage 12-14, it may be made small to fit on the same IC as amplifier 10.

Current mirror 40-42 may be configured with unequal collector areas having a ratio of say four to one to reduce the current flow in the emitter of transistor 42. If the collector transistor 40 is made four times smaller than the collector of transistor 42, then the collector of transistor 42 conducts four times the current as the collector of transistor 40 and reduces the overall current supplied by charge pump 36.

The operation of amplifier circuit 10 proceeds as follows. Assume a balanced condition where the bases of transistors 12 and 14 receive equal amplitude signals. Transistors 12 and 14 conduct equal currents through resistors 19 and 25 and develop equal voltages at nodes 18 and 24. Transistors 16 and 22 receive the same base signal and conduct the same current given the equal emitter voltages at nodes 18 and 24. Transistor 16 conducts the current that is sourced by transistor 28 while transistor 22 conducts the current that is sourced by transistor 30 with a balanced differential input signal $V_{IN}$.

When the signal to the base of transistor 12 is less than the signal to the base of transistor 14, transistor 12 conducts more current causing the voltage at node 18 to increase. Less current flows through transistor 14 and resistor 25 causing the voltage at node 24 to decrease.

The lower voltage at node 24 increases the base-emitter junction potential of transistor 22 and causes it to conduct more current than transistor 30 sources. Consequently, transistor 22 decreases the voltage level at the input of output stage 34 and causes the output signal $V_{OUT}$ to increase.

If the differential input voltage $V_{IN}$ reverses polarity such that the signal applied to the base of transistor 14 is less in amplitude than that applied to the base of transistor 12, then transistor 14 conducts more of the current $I_{42}$. The voltage at node 24 to increases and the voltage at node 18 decreases. The higher voltage at node 24 decreases the base-emitter junction potential of transistor 22 and causes it to conduct less current than transistor 30 sources. The voltage level at the input of output stage 34 increases causing the output signal $V_{OUT}$ to decrease.

Charge pump 26 receives the one volt operating potential from power supply conductor 32 and provides a pump voltage $V_{PUMP}$ of 1.8 volts to the emitters of current mirror circuit 40-42. The increased operating potential $V_{PUMP}$ provides additional headroom for the common mode operating range of the differential signal $V_{IN}$. Assuming 800 millivolts of headroom for the saturation potential of current source transistor 42 and base-emitter junction potentials of transistors 12 and 14, the pump voltage $V_{PUMP}$ provides a one volt common mode operating range for the differential input voltage $V_{IN}$. Resistors 19 and 25 allow the differential input signal to approach the $V_{EE}$ power supply rail.

An important part of the present invention is that charge pump 36 supplies current through transistor 42 only to the differential input stage comprising transistors 12 and 14. Transistors 16, 22, 28 and 30, and output stage 34 receive operating potential directly from power supply conductor 32. Hence, charge pump 36 including internal charging capacitors (not shown) is fabricated on the same integrated circuit die as amplifier circuit 10 since it need supply very small amounts of current.

Figure 2:
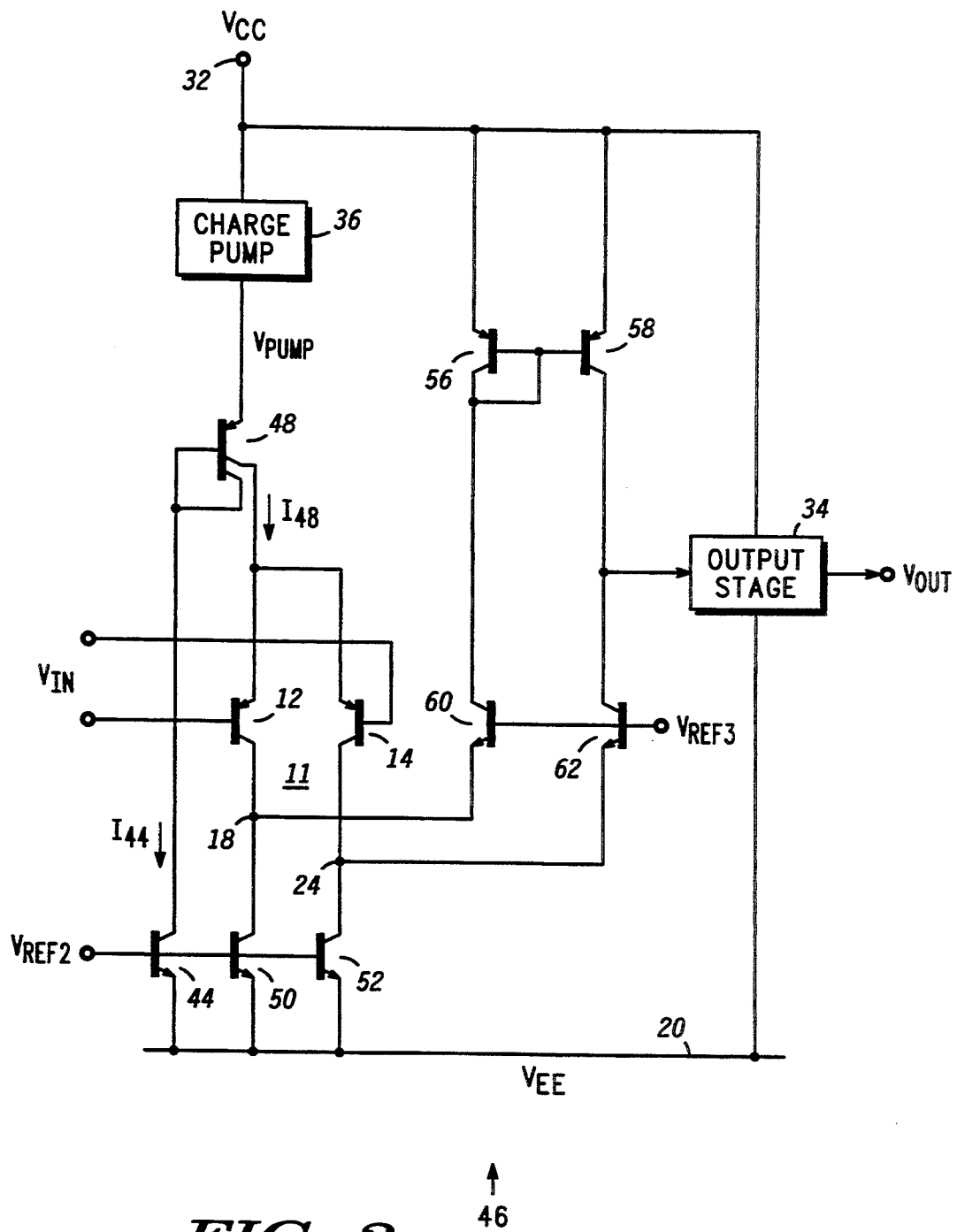
FIG. 2 is a schematic and block diagram illustrating an alternate embodiment of the differential input stage of the amplifier.

In an alternate embodiment, amplifier circuit 46 is shown in FIG. 2 with split-collector transistor 48 receiving the voltage $V_{PUMP}$ from charge pump 36 at its emitter. A first collector of transistor 48 is coupled to its base and further coupled to the collector of transistor 44. A second collector of transistor 48 is coupled to the emitters of transistors 12 and 14. Current source transistor 50 has a collector coupled to node 18 and an emitter coupled to power supply conductor 20. Current source transistor 52 has a collector coupled to node 24 and an emitter coupled to power supply conductor 20. The bases of transistors 50 and 52 receive reference potential $V_{REF2}$. Transistors 56 and 58 are arranged as a current mirror with their emitters coupled to power supply conductor 32. The base and collector of transistor 56 is coupled to the collector of transistor 60. The base of transistor 58 is coupled to the base and collector of transistor 56, while the collector of transistor 58 is coupled to the collector of transistor 62 at the input of output stage 34. The bases of transistors 60 and 62 receive reference potential $V_{REF3}$ operating at about 700 millivolts. The emitters of transistors 60 and 62 are coupled to nodes 18 and 24, respectively. Other components having the same reference number used in FIG. 1 perform a similar function.

The current $I_{44}$ sunk by current source transistor 44 flows through the first collector of transistor 48 causing a similar current to flow through the second collector of transistor 48 into the principal conduction path of differential transistor pair 12-14 depending on the polarity of the input signal $V_{IN}$. Transistor 48 may also be configured with unequal collector areas having a ratio of say four to one to reduce the current flow in the emitter of transistor 48. If the first collector transistor 48 is made say four times smaller than the second collector, then the first collector conducts four times the current as the second conductor and reduces the overall current supplied by charge pump 36.

For a balanced condition where the bases of transistors 12 and 14 receive equal amplitude signals, transistors 12 and 14 conduct equal currents of say 0.5 microamps. Current source transistors 50 and 52 also conduct equal currents of 1.0 microamps. With the differential input signal balanced, the voltages at nodes 18 and 24 are equal. Transistors 60 and 62 conduct equal currents of 0.5 microamps with equal emitter voltages to complete the 1.0 microamps drawn by transistors 50 and 52. The current flowing through transistor 60 is mirrored through transistors 56 and 58 and subsequently flows through transistor 62.

When the signal to the base of transistor 12 is less than the signal to the base of transistor 14, transistor 12 conducts more current causing transistor 60 to conduct less current to sink the 1.0 microamp current into transistor 50. The reduced current flow through transistor 60 is mirrored through transistors 56 and 58. Transistor 14 conducts less current causing transistor 62 to conduct more current to supply transistor 52. With transistor 58 conducting less current and transistor 62 conducting more current, the voltage level at the input of output stage 34 decreases and causes the output signal $V_{OUT}$ to increase.

If the differential input signal $V_{IN}$ reverses polarity such that the signal applied to the base of transistor 14 is less in amplitude than that applied to the base of transistor 12, then transistor 14 conducts more of the current $I_{48}$ and transistor 12 conducts less current of the current $I_{48}$. Transistor 60 conducts more current into transistor 50 to make up the shortage from transistor 12. The increased current flow through transistor 60 is mirrored through transistors 56 and 58. With transistor 14 conducting more current due to the differential input signal, transistor 62 conducts less current to supply the 1.0 microamps through transistor 52. With transistor 58 conducting more current and transistor 62 conducting less current, the voltage level at the input of output stage 34 increases and causes the output signal $V_{OUT}$ to decrease.

By now it should be appreciated that the present invention uses a charge pump to supply current to a differential transistor pair as part of an input stage of an amplifier circuit. A current source sets a predetermined current through a current mirror circuit or a split-collector transistor to sink a constant current from a charge pump to the conduction paths of the differential transistor pair. The charge pump allows the amplifier to operate with a low power supply potential such as 1.0 volt. The charge pump pumps up the differential transistor pair to provide additional common mode operating range for the differential input signal. The active components other than the differential transistor pair, including the output stage of the amplifier circuit, operate off the 1.0 volt power supply potential. The charge pump may be fabricated on the same IC as the amplifier, including any necessary pump capacitors, since it need supply only the differential transistor pair.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An input stage of amplifier circuit, comprising:
   a differential transistor pair operating in response to a differential input signal for developing first and second voltages;
   circuit means responsive to said first and second voltages for providing an output signal of the input stage of the amplifier circuit;
   a charge pump coupled for receiving an operating potential from a first power supply conductor and having an output for providing a pump voltage;
   a first current source for providing a predetermined current at an output; and
   a current mirror circuit having first and second conduction paths, said first conduction path being coupled between said output of said first current source and said output of said charge pump, said second conduction path being coupled between said output of said charge pump and a conduction path of said differential transistor pair.

2. The amplifier circuit of claim 1 further including an output stage operating in response to said output signal from the input stage for providing an output signal of the amplifier, said output stage being coupled for receiving said operating potential from said first power supply conductor.

3. The input stage of claim 2 wherein said current mirror circuit includes:
   a first transistor having a base, an emitter and a collector, said base and said collector being coupled together to said output of said first current source, said emitter being coupled to said output of said charge pump; and
   a second transistor having a base, an emitter and a collector, said base being coupled to said base and said collector of said first transistor, said emitter being coupled to said output of said charge pump, said collector being coupled to said conduction path of said differential transistor pair.

4. The input stage of claim 2 wherein said current mirror circuit includes a first transistor having a base, an emitter and first and second collectors, said base and said first collector being coupled together to said output of said first current source, said emitter being coupled to said output of said charge pump, said second collector being coupled to said conduction path of said differential transistor pair.

5. The input stage of claim 3 wherein said first current source includes a third transistor having a base, an emitter, a collector, said collector being coupled to said base and said collector of said first transistor, said base being coupled for receiving a first reference potential, said emitter being coupled to a second power supply conductor.

6. The input stage of claim 5 wherein said differential transistor pair includes:
   a fourth transistor having a base, an emitter and a collector, said emitter being coupled to said collector of said second transistor;
   a first resistor coupled between said collector of said fourth transistor at a first node and said second power supply conductor for developing said first voltage;
   a fifth transistor having a base, an emitter and a collector, said bases of said fourth and fifth transistors being coupled for receiving said differential input signal, said emitter being coupled to said collector of said second transistor; and
   a second resistor coupled between said collector of said fifth transistor at a second node and said second power supply conductor for developing said second voltage.

7. The input stage of claim 6 wherein said circuit means includes:
   a second current source for providing second and third currents of predetermined magnitude at first and second outputs respectively;
   a sixth transistor having a base, an emitter and a collector, said emitter being coupled to said first node, said base and said collector being coupled to said first output of said second current source; and
   a seventh transistor having a base, an emitter and a collector, said base being coupled to said base and said collector of said sixth transistor, said emitter being coupled to said second node, said collector being coupled to said second output of said second current source, said collector being further coupled to said input of said output stage for providing said output signal of the input stage of the amplifier circuit.

8. The input stage of claim 7 wherein said second current sources includes:
   an eighth transistor having a base, an emitter and a collector, said emitter being coupled to said first power supply conductor, said base being coupled for receiving a second reference potential, said collector being coupled to said collector and said base of said sixth transistor; and
   a ninth transistor having a base, an emitter and a collector, said emitter being coupled to said first power supply conductor, said base being coupled for receiving said second reference potential, said collector being coupled to said collector of said seventh transistor.

9. An amplifier circuit, comprising:
   a differential transistor pair operating in response to a differential input signal for developing first and second voltages;
   circuit means responsive to said first and second voltages for providing an output signal of the input stage of the amplifier circuit;
   a charge pump coupled for receiving an operating potential from a first power supply conductor and having an output for providing a pump voltage;
   a first current source for providing a predetermined current at an output;
   a first transistor having a base, an emitter and a collector, said base and said collector being coupled together to said output of said first current source, said emitter being coupled to said output of said charge pump;
   a second transistor having a base, an emitter and a collector, said base being coupled to said base and said collector of said first transistor, said emitter being coupled to said output of said charge pump, said collector being coupled to a conduction path of said differential transistor pair; and
   an output stage operating in response to said output signal from the input stage for providing an output signal of the amplifier, said output stage being coupled for receiving said operating potential from said first power supply conductor.

10. The amplifier circuit of claim 9 wherein said first current source includes a third transistor having a base, an emitter, a collector, said collector being coupled to said base and said collector of said first transistor, said base being coupled for receiving a first reference potential, said emitter being coupled to a second power supply conductor.

11. The amplifier circuit of claim 10 wherein said differential transistor pair includes:
   a fourth transistor having a base, an emitter and a collector, said emitter being coupled to said collector of said second transistor;
   a first resistor coupled between said collector of said fourth transistor at a first node and said second power supply conductor for developing said first voltage;
   a fifth transistor having a base, an emitter and a collector, said bases of said fourth and fifth transistors being coupled for receiving said differential input signal, said emitter being coupled to said collector of said second transistor; and
   a second resistor coupled between said collector of said fifth transistor at a second node and said second power supply conductor for developing said second voltage.

12. The input stage of claim 11 wherein said circuit means includes:
   a second current source for providing second and third currents of predetermined magnitude at first and second outputs respectively;
   a sixth transistor having a base, an emitter and a collector, said emitter being coupled to said first node, said base and said collector being coupled to said first output of said second current source; and
   a seventh transistor having a base, an emitter and a collector, said base being coupled to said base and said collector of said sixth transistor, said emitter being coupled to said second node, said collector being coupled to said second output of said second current source, said collector being further coupled to said input of said output stage for providing said output signal of the input stage of the amplifier circuit.

13. The input stage of claim 12 wherein said second current sources includes:
   an eighth transistor having a base, an emitter and a collector, said emitter being coupled to said first power supply conductor, said base being coupled for receiving a second reference potential, said collector being coupled to said collector and said base of said sixth transistor; and
   a ninth transistor having a base, an emitter and a collector, said emitter being coupled to said first power supply conductor, said base being coupled for receiving said second reference potential, said collector being coupled to said collector of said seventh transistor.

14. An input stage of amplifier circuit, comprising:
   a differential transistor pair operating in response to a differential input signal for developing first and second voltages;
   circuit means responsive to said first and second voltages for providing an output signal of the input stage of the amplifier circuit;
   a charge pump coupled for receiving an operating potential from a first power supply conductor and having an output for providing a pump voltage;
   a first current source for providing a predetermined current at an output; and
   a first transistor having a base, an emitter and first and second collectors, said base and said first collector being coupled together to said output of said first current source, said emitter being coupled to said output of said charge pump, said second collector being coupled to said conduction path of said differential transistor pair.

15. The amplifier circuit of claim 14 further including an output stage operating in response to said output signal from the input stage for providing an output signal of the amplifier, said output stage being coupled for receiving said operating potential from said first power supply conductor.

16. The input stage of claim 15 wherein said first current source includes a second transistor having a base, an emitter, a collector, said collector being coupled to said base and said first collector of said first transistor, said base being coupled for receiving a first reference potential, said emitter being coupled to a second power supply conductor.

17. The input stage of claim 16 wherein said differential transistor pair includes:
   a third transistor having a base, an emitter and a collector, said emitter being coupled to said second collector of said first transistor; and
   a fourth transistor having a base, an emitter and a collector, said bases of said third and fourth transistors being coupled for receiving said differential input signal, said emitter being coupled to said second collector of said first transistor.

18. The input stage of claim 17 wherein said circuit means includes:
   a fifth transistor having a base, an emitter and a collector, said collector being coupled to said collector of said third transistor at a first node for developing said first voltage, said base being coupled for receiving said first reference potential, said emitter being coupled to said second power supply conductor; and
   a sixth transistor having a base, an emitter and a collector, said collector being coupled to said collector of said fourth transistor at a second node for developing said second voltage, said base being coupled for receiving said first reference potential, said emitter being coupled to said second power supply conductor.

19. The input stage of claim 18 wherein said circuit means further includes:
   a current mirror circuit having an input and an output;
   a seventh transistor having a base, an emitter and a collector, said collector being coupled to said input of said current mirror circuit, said base being coupled for receiving a second reference potential, said emitter being coupled to said first node; and
   an eighth transistor having a base, an emitter and a collector, said collector being coupled to said output of said current mirror circuit at said input of said output stage for providing said output signal of the input stage of the amplifier circuit, said base being coupled for receiving said second reference potential, said emitter being coupled to said second node.

20. The input stage of claim 19 wherein said current mirror circuit includes:
a ninth transistor having a base, an emitter and a collector, said emitter being coupled to said first power supply conductor, said base and said collector being coupled together to said collector of said seventh transistor; and
a tenth transistor having a base, an emitter and a collector, said emitter being coupled to said first power supply conductor, said base being coupled to said base and said collector of said ninth transistor, said collector being coupled to said collector of said eighth transistor at said input of said output stage.

* * * * *